(12) United States Patent  
Murata (10) Patent No.: US 7,683,646 B2  
(45) Date of Patent: Mar. 23, 2010

(54) PROBE CARD AND METHOD OF PRODUCING THE SAME BY A FINE INKJET PROCESS

(75) Inventor: Kazuhiro Murata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 181 days.

(21) Appl. No.: 11/883,226

(22) PCT Filed: Dec. 9, 2005

(86) PCT No.: PCT/JP2005/022614

§ 371 (c)(1),
(2), (4) Date: Sep. 27, 2007

(87) PCT Pub. No.: WO2006/080146

PCT Pub. Date: Aug. 3, 2006

(65) Prior Publication Data

US 2008/0111567 A1   May 15, 2008

(30) Foreign Application Priority Data

Jan. 31, 2005   (JP) ............................. 2005-024117

(51) Int. Cl.
*G01R 31/02* (2006.01)

(52) U.S. Cl. ................... 324/754; 324/761; 324/762
(58) Field of Classification Search .............. None
See application file for complete search history.

(56) References Cited

U.S. PATENT DOCUMENTS

2005/0116069 A1   6/2005   Murata  
2006/0261826 A1*  11/2006  Ito ........................ 324/754

FOREIGN PATENT DOCUMENTS

| JP | 7-72171 A | 3/1995 |
| JP | 10-140325 A | 5/1998 |
| JP | 2002-340933 A | 11/2002 |
| JP | 2003-218149 A | 7/2003 |
| JP | 2004-165587 A | 6/2004 |
| JP | 2005-109467 A | 4/2005 |

* cited by examiner

*Primary Examiner*—Minh N Tang  
(74) *Attorney, Agent, or Firm*—Birch, Stewart, Kolasch & Birch, LLP

(57) ABSTRACT

A method of producing a probe card where a sintering process is not required for each ejection of a droplet and fine bumps that become probes can be formed in a short time. A liquid material containing metal ultra-fine particles is ejected onto a substrate in accordance with a fine inkjet process, and fine bumps are formed on the substrate. The manufacturing process is simplified so that energy can be saved and resources can be saved.

19 Claims, 5 Drawing Sheets

PROBE CARD AND METHOD OF PRODUCING THE SAME BY A FINE INKJET PROCESS

TECHNICAL FIELD

The present invention relates to a method of forming a bump by ejecting a liquid material containing metal ultra-fine particles in accordance with a fine inkjet process, and also relates to a method of producing a probe card by forming bumps that become probes on a substrate. In addition, the present invention relates to a probe card where bumps having a microscopic diameter formed in accordance with a fine inkjet process are provided on a substrate as probes, and also relates to a probe card where the bumps are formed above a flexible resin.

BACKGROUND ART

Tests of semiconductors are generally carried out in accordance with a method in which a probe card having plural three-dimensional metal terminals (probes) is made to make contact with a bare semiconductor chip. As a method of forming probes on a probe card, plating methods, methods directly using a metal probe, methods using solder, methods where a bonding wire is broken through pulling, and the like can be cited. However, recently the distance between terminals in semiconductors has been rapidly becoming smaller due to reduction in the pitch of wires, and it has become impossible to deal with this using the methods described above.

In addition, various arrangements have been introduced for terminals in recent years, and it has been necessary to flexibly deal with frequent change in the arrangement of terminals. Meanwhile, it is difficult to sufficiently meet this requirement using the above-described forming methods used at present.

As a method for solving these problems, formation of a probe through inkjet has been attempted. Patent Document 1, for example, discloses a method in which a liquid composition containing a conductive material is ejected onto a substrate, the droplet is left to be solidified on the substrate, and the composition is stacked by repeating the ejection, to give a bump. However, in accordance with this method, layers are stacked while being sintered one by one, and therefore, it takes too much time to give a structure having a sufficient height. In addition, the amount of droplets ejected onto the substrate cannot be reduced, and therefore, formation of fine bumps is difficult and the requirement for reducing the pitch of terminals of semiconductors cannot be met.

Patent Document 1: JP-A-2003-218149 ("JP-A" means unexamined published Japanese patent application)

DISCLOSURE OF INVENTION

Problems that the Invention is to Solve

The present invention contemplates providing a method of producing a probe card where the manufacturing process is simplified so that energy and resources can be saved. In addition, the present invention contemplates providing a probe card which can flexibly deal with reduction in the pitch of terminals, variation in the arrangement of terminals, frequent change in these and the like, and a producing method of the same.

Further, the present invention contemplates providing a method of producing a probe card where a sintering process is not required for each ejection of a droplet and fine bumps that become probes can be formed in a short time.

Furthermore, the present invention contemplates providing a probe card that has cushioning effects against pressure when the probe card makes contact with a semiconductor chip, so that uniform contact is made possible for all of the probe terminals, and a producing method of the same.

Means to Solve the Problems

The above problems can be attained by the following means:

(1) A method of producing a probe card, which comprises steps of:
ejecting a liquid material containing metal ultra-fine particles onto a substrate in accordance with a fine inkjet process; and
forming fine bumps on the substrate;

(2) The method of producing a probe card as described in the above item (1), wherein a nucleus portion of the fine bumps is formed of a silver material and a surface layer portion of the fine bumps is formed of a gold material;

(3) The method of producing a probe card as described in the above item (1) or (2), wherein a substrate having flexibility is used as the substrate;

(4) The method of producing a probe card as described in any one of the above items (1) to (3), wherein a resin having flexibility is provided on the substrate and the fine bumps are formed above the resin;

(5) The method of producing a probe card as described in any one of the above items (1) to (4), wherein the diameter of the fine bumps in a cross section is 1 to 50 µm;

(6) The method of producing a probe card as described in any one of the above items (1) to (5), wherein the fine inkjet process comprises, to form the fine bumps, flying and landing fine droplets onto the substrate by a focused electric field, and drying and solidifying the fine droplets to be stacked up;

(7) A probe card, comprising fine bumps on a substrate, wherein the fine bumps are formed by ejecting a liquid material containing metal ultra-fine particles in accordance with a fine inkjet process;

(8) The probe card as described in the above item (7), wherein a resin having flexibility is provided on the substrate and the fine bumps are formed above the resin;

(9) The probe card as described in the above item (7) or (8), wherein the diameter of the fine bumps in a cross section is 1 to 50 µm;

(10) The probe card as described in any one of the above items (7) to (9), wherein a group of the fine bumps is provided with a short pitch on the substrate;

(11) The probe card as described in any one of the above items (7) to (10), wherein a nucleus portion of the fine bumps is formed of a silver material and a surface layer portion of the fine bumps is formed of a gold material; and (12) The probe card as described in any one of the above items (7) to (11), wherein heat treatment is carried out on the fine bumps so that pores are created within the fine bumps.

EFFECTS OF THE INVENTION

According to the method of producing a probe card of the present invention, the manufacturing process of a probe card can be simplified by using an inkjet, so that energy and resources can be saved.

In addition, according to the method of producing a probe card of the present.invention, fine bumps can be formed in various patterns by changing process data for controlling inkjet ejection, and thus, frequent change in the arrangement of terminals can be flexibly dealt with.

Furthermore, according to the method of producing a probe card of the present invention, a fine droplet ejected at the time of the formation of a fine bump easily dries, and therefore, a sintering process is not required for each ejection of a droplet, and thus, it is possible to form fine bumps that become probes in a short time.

Furthermore, in a probe card produced by the producing method of the present invention, fine bumps are used as probes, and therefore, the requirements for reduction in the pitch can be met. In addition, the probe card has cushioning effects against pressure when the probes make contact, and uniform contact is possible among all of the probe terminals.

DESCRIPTION OF NUMERALS

1 Nozzle (Needle-shaped fluid discharging body)
2 Metal electrode wire
3 Fluid (Solution)
4 Shield rubber
5 Nozzle clamp
6 Holder
7 Pressure regulator
8 Pressure tube
9 Computer
10 Prescribed waveform generation device
11 High-voltage amplifier
12 Lead
13 Substrate
14 Substrate holder
100 Substrate
101 Nozzle (Needle-shaped fluid discharging body)
102 Fine droplet (droplet having fine diameter)
103 Solidified liquid droplet
104 Structure
105 Three-dimensional structure
201 Substrate
202 Electrode
203 Bump (nucleus portion)
204 Bump (surface layer portion)
205 Resin (resin having flexibility)

BEST MODE FOR CARRYING OUT THE INVENTION

The method of producing a probe card of the present invention is characterized in that a bump (hereinafter referred to as a three-dimensional structure or a three-dimensional body) that becomes a probe is formed in accordance with a fine inkjet process. In the following, the present invention is described in detail.

In the fine inkjet process, an electric field is used so that a fine fluid flies onto a substrate and the fine fluid solidifies at a high speed due to the quick drying properties of the fine droplets, and thus a three-dimensional structure is formed. It is preferable for the fine droplet used for the formation of the three-dimensional structure to have a droplet diameter of 15 μm or less, it is more preferable of 5 μm or less, it is still more preferable of 3 μm or less, and it is particularly preferable of 1 μm or less.

It is preferable for the structure formed of fine droplets to have a cross-sectional diameter (diameter of a short side in a cross section or at the bottom) of 50 μm or less, it is more preferable of 20 μm or less, it is still more preferable of 15 μm or less, it is further more preferable of 5 μm or less, it is further more preferable of 3 μm or less, and it is particularly preferable of 1 μm or less (in the present invention, the structure formed of fine droplets is referred to as fine bump or fine three-dimensional structure, or simply referred to as bump or three-dimensional structure).

Further, according to a fine inkjet process that can be used in the present invention, the interval between three-dimensional structures (distance between the closest wall surfaces of two adjacent three-dimensional structures) can be made larger or smaller depending on a required arrangement of terminals. It is naturally possible to manufacture three-dimensional structures with the same probe pitch as with commonly used probe cards (15 to 100 μm). In addition, it is also possible to cope with a pitch of as small as 10 μm or smaller (for example approximately 5 μm) and meet the requirements for miniaturization.

The three-dimensional structure formed in a method of producing a probe card of the present invention is such that grows not two-dimensionally but three-dimensionally in the direction of height, and the three-dimensional structure is formed preferably in the shape in which height is equal to or more than the cross-sectional diameter of its base portion; in other words, the three-dimensional structure has an aspect ratio of 1 or more, preferably has an aspect ratio of 2 or more, more preferably has an aspect ratio of 3 or more, and particularly preferably has an aspect ratio of 5 or more. There is not an upper limit to the height or the aspect ratio of the three-dimensional structure, and the three-dimensional structure can be grown to be of an aspect ratio of 100 or more, or 200 or more, if the three-dimensional structure can stand by itself even if it is slightly bent. Taking their use as probes into consideration, it is preferable for the height of the three-dimensional structures to be 5 μm to 50 μm, and it is more preferable for it to be 10 μm to 30 μm.

There are no limitations in terms of the form of the three-dimensional structure, and the form may be a column, an elliptical column, a cone, a truncated cone, a form of which the projected shape from above is linear, or a box, and the structure may have a hollow structure. In addition, bumps formed according to the fine inkjet process are referred to as fine bumps, specifically in the case where they are distinguished from the bumps gained according to the prior art.

In the method of producing a probe card of the present invention, three-dimensional structures are formed by ejecting fine droplets in accordance with a fine inkjet process. Such fine droplets are evaporated extremely quickly by the influence of surface tension and the magnitude of a specific surface area. Hence, by controlling the drying and solidifying of the droplet (in the present invention, unless otherwise specified, the term of "drying and solidifying" means that the droplets drops are evaporated and dried, thereby being increased in viscosity at least to a level such that the droplets can be stacked up), impact energy, focusing of electric filed, and the like at appropriate levels, it is possible to form a three-dimensional structure having height.

Further, in a fine inkjet process, stress toward the tip of a needle-shaped fluid discharging body (hereinafter also referred to as "nozzle") is continuously applied to the top of a structure formed by droplets that have been previously landed to a substrate (hereinafter also referred to as "previously landed droplets") and that have been solidified, in virtue of an effect of an electric field applied to an ultra-fine inkjet. Accordingly, once a structure starts growing, an electric field can be focused on the top of the structure. For this reason, an ejected droplet can be reliably and accurately landed on the top of the structure formed by the droplets having landed in advance.

Furthermore, the structure can be grown in the direction of the nozzle while it is always pulled by the above-mentioned effect produced by the electric field, and hence even if the structure has a high aspect ratio the structure can be formed without falling. These effects can efficiently promote the growth of a three-dimensional structure. In addition, the electric field may not be applied between the liquid ejecting nozzle and the substrate, and instead, an electric field generated by an electrode provided in a location different from the nozzle may be used. Further, a driving voltage, a driving voltage waveform, a driving frequency, or the like may be changed in accordance with the growth of the structure.

Figure 1:
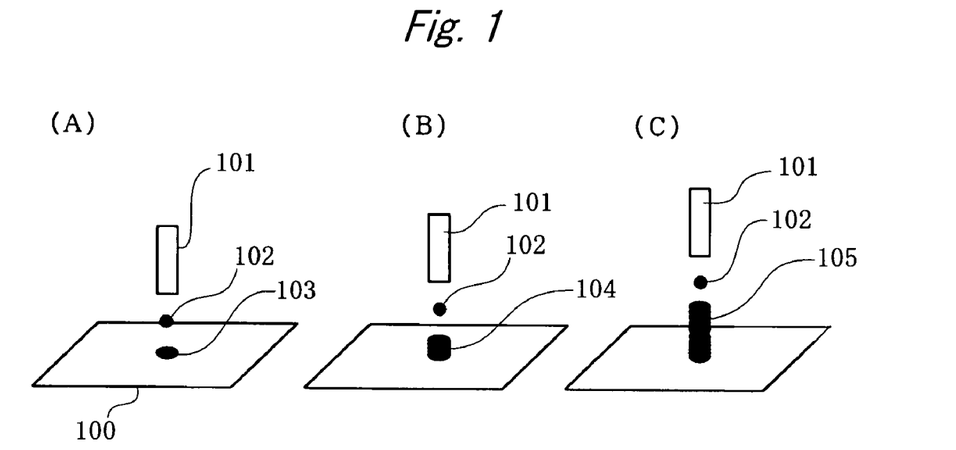
[FIG. 1] It is a schematic drawing to show steps of a beginning stage (A), a middle stage (B), and a later stage (C), for producing a fine three-dimensional structure in the production method of the present invention.

This process is schematically shown in FIG. 1. (A) shows a beginning stage of forming a three-dimensional structure. A fine droplet 102 ejected toward a substrate 100 from a nozzle 101 lands on the substrate 100, and being brought into the state of a solidified liquid droplet (substance such that the liquid drop is solidified) 103. (B) shows a middle stage in which the droplets continuously land and solidify and stack to form a structure 104. (C) shows a later stage in which the ultra-fine droplets land concentrically to the top of the structure having stacked on the substrate in the above-mentioned manner to form a three-dimensional structure 105.

According to the method of producing a probe card of the present invention, it is preferable for a liquid material ejected through a fine inkjet for forming the three-dimensional structure to have a high permittivity and a high conductivity. For example, a liquid material preferably has a dielectric constant of 1 or more, more preferably 2 to 10, besides it preferably has conductivity of $10^{-5}$ S/m or more. It is preferable that fluid material easily generating focus of an electric field is used for the method. It is preferable that a liquid material and a substance such that the liquid fluid material is solidified have a dielectric constant higher than the material of the substrate. An electric field is generated on the surface of the substrate by voltage applied to the nozzle. In this case, when a droplet lands and attaches on the substrate, the density of an electric line of force passing through the liquid becomes higher than that in a portion of the substrate where the droplet does not attach. This state is referred to as a state where focusing of an electric field is developed. Then, once a structure starts to be generated, at the top of the structure, there occurs polarization due to the electric field or focusing of the electric line of force due to its shape. The droplet flies along the electric line of force and the droplet is attracted to a portion where the density of the electric line of force is the highest. That is, the droplet is attracted to the top of the pre-formed structure. For this reason, a subsequently flying droplet stacks selectively and accurately on the top of the structure.

It is preferable for the substrate to be made of such a material that excellent performance can be gained when a probe card is made. In the following, the substrate is described.

It is necessary to electrically insulate individual probes, for example, and therefore, it is preferable for the substrate to be an insulator. In addition, it is preferable to use a substrate having flexibility (in the present invention, the term "flexibility" includes elasticity, and the term "substrate having flexibility" means a substrate having flexibility or elasticity to such a degree as to absorb the inconsistency in the height of the bumps). As a result, when the bumps as probes are made to contact with a semiconductor chip, the pressure of contact is absorbed. Furthermore, the inconsistency in the height of the bumps is reduced, so that uniform contact (in the present invention, the term "uniform contact" refers to a state where contact to such a degree that conductivity can be gained can be widely secured among plural bumps) can be provided, making measurement with higher precision possible. Examples of the substrate having flexibility include polyimide, polyethylene terephthalate and silicone resins, and examples of the substrate having low flexibility include glass, silicon, ceramics and an epoxy resin. The thickness of the substrate is not particularly limited, and it is preferably 1 to 5,000 μm, and more preferably 100 to 5,000 μm.

In addition, a resin having flexibility may be provided between the substrate and the three-dimensional structures, in order to provide flexibility. It is preferable for the resin having flexibility to have thermoplastic properties and/or photocuring properties, and examples include silicon resins, rubbers and PMMA. The thickness of the resin layer is not particularly limited, and it is preferably 1 to 1,000 μm, and more preferably 5 to 500 μm. In addition, the resin may be provided on the entire surface of the substrate or provided only on a part of the substrate, and it is preferable that the resin is provided at least beneath the bumps. At this time, it is not necessary for the bumps and the resin to make contact with each other, and the resin may be beneath the bumps in such a positional relationship that the resin can absorb the inconsistency in the height of the bumps. As the method of forming the resin, formation of ejection of fine inkjet, patterning using a dispenser or the like, letter press printing, intaglio printing, technology for light exposure, laser exposure, laser etching and electron beams exposure can be cited as examples.

Furthermore, electrodes are connected to the bumps so that signals from the probes can be taken out. As the method of providing an electrode on a substrate and/or a resin, formation through ejection of fine inkjet, etching, technology for light exposure, dispensing, letter press printing, intaglio printing, technology for light exposure, laser exposure, laser etching and electron beams exposure can be cited as examples. Though the thickness of the electrodes is not particularly limited, it is preferably, for example, 0.1 to 100 μm, and more preferably 1 to 50 μm. The material for the electrodes may be the same as that conventionally used, and examples include gold, copper and silver.

The resistance to heat of the materials for the substrate, the resin, the electrodes and the like that can be used in the probe card is preferably 150° C. or more, and more preferably 200° C. or more.

In the method of producing a probe card of the present invention, as the liquid material used for the formation of the three-dimensional structure, a liquid material containing metal ultra-fine particles (for example, metal ultra-fine particle pastes); a polymer solution, such as an ethanol solution of polyvinyl phenol (for example, Malcalinker (trade name)); a sol-gel solution of ceramics; a solution of a low molecular substance, such as oligothiophene; a photocuring resin; a thermosetting resin; and a micro-bead fluid can be used, and one type from among these solutions may be used, or a number of solutions may be combined for use. From among these, it is preferable to use a liquid material containing metal ultra-fine particles in order to provide conductivity, which is preferable for the probes. Examples of the metal species in the liquid materials containing the metal ultra-fine particulates used in the present invention are almost all kinds of metals or oxides thereof. A preferable metal is a metal having electro-conductivity such as gold, silver, copper, platinum, palladium, tungsten, tantalum, bismuth, lead, tin, indium, zinc, titanium, nickel, iron, cobalt, aluminum, or the like. A more preferable metal is gold, silver, copper, platinum, or palladium. A particularly preferable metal is gold or silver. A single metal may be used, or an alloy made of two or more metals may be used. The metal ultra-fine particulates preferably have a particle diameter from 1 to 100 nm, more preferably from 1 to 20 nm, and particularly preferably from 2 to 10 nm.

Though the three-dimensional structures may be formed of one type of material or two or more types of materials (for example, a multilayer structure), it is preferable that at least the surface layer portion is formed of a conductive material, in order to secure conductivity for the probes. In the case where the three-dimensional structures are formed of two or more types of materials, it is preferable that the core portion (nucleus portion) is formed of a hard material, and the surface layer portion is formed of a conductive material. A gold material is particularly preferably used as the material for the surface layer portion. In this constitution, the strength and the conductivity required for the probes can both be gained. As a preferable combination, an example where the nucleus portion is formed of a silver material and the surface layer portion is formed of a gold material, can be cited (in the present invention, it is preferable for the surface layer portion to have a thickness ranging from approximately 0.1 to 10 μm from the outer surface of the three-dimensional structures, and the nucleus portion refers to the part inside the surface layer portion). As other embodiments, the nucleus portion may be formed of a material other than metal (for example, a resin material, such as a polymer) and the surface layer portion may be formed of a metal material (for example, a gold material).

Figure 2:
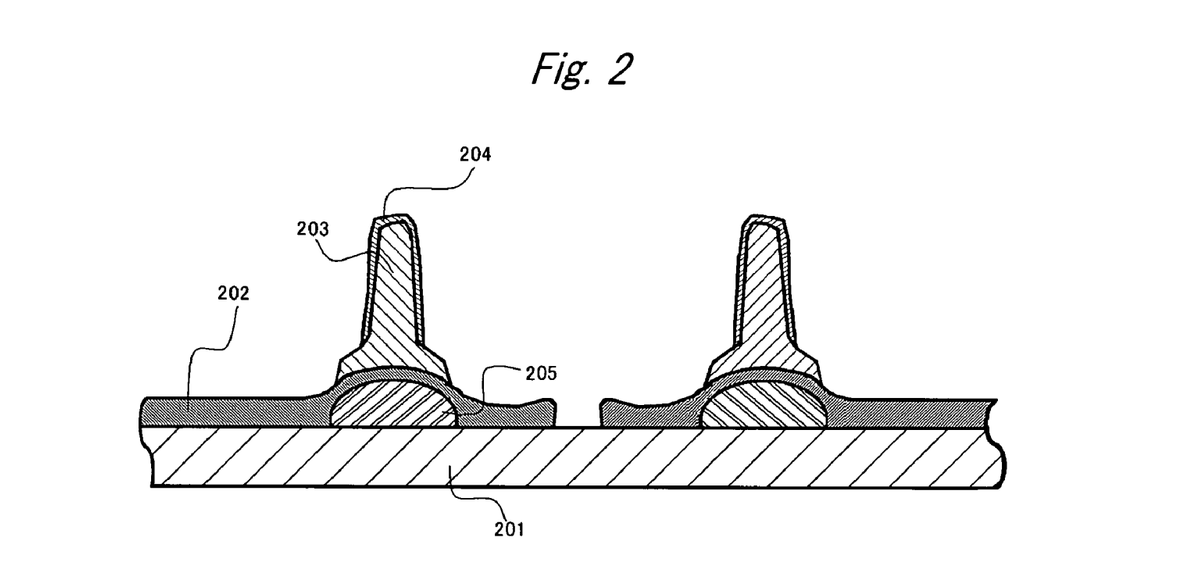
[FIG. 2] It is a partial cross sectional diagram schematically showing an example of a probe card produced according to the producing method of the present invention.

FIG. 2 shows an example of a probe card produced by the method of producing a probe card of the present invention as a preferable embodiment. In FIG. 2, a resin having flexibility 205 is provided on a substrate 201, and an electrode 202 is provided thereon. On the electrode 202, a bump is formed above the resin 205. The bump has a two-layer structure of a nucleus portion 203 and a surface layer portion 204.

In addition, in the method of producing a probe card of the present invention, heat treatment may be carried out after the formation of the bumps (in the present invention, heat treatment includes sintering treatment unless otherwise particularly specified). An appropriate temperature can be set for heat treatment on the basis of the properties, for example the melting point of the used metal or alloy. It is preferable for the temperature to be such that pores are created inside the bumps (in the present invention, pores refers to spaces created when metal ultra-fine particles are sintered together through heat treatment). The temperature for heat treatment is preferably 50 to 300° C., and more preferably 100 to 250° C. Heat treatment may be carried out according to an ordinary method, and can be carried out though laser irradiation, infrared ray beam irradiation, or using a gas or a vapor at a high temperature, for example. As the atmosphere at the time of heat treatment, air, an inert gas atmosphere, a reduced pressure atmosphere, an atmosphere of a reducing gas, such as hydrogen, and the like can be used, and an atmosphere of a reducing gas is preferable, in order to prevent the metal ultra-fine particles from oxidizing.

Bumps where pores are-created are plastically deformed so that the height can be modified (inconsistency in the height of the bumps can be adjusted). It is possible to induce deformation so that the height becomes uniform, for example, using the pressure of contact through the operation of measurement, in which probes are made to make contact with a semiconductor chip, without applying any special process for correcting the height.

In the method of producing a probe card of the present invention, though whatever a number of bumps may be provided on a probe card, 1 to 100,000 is preferable and 10 to 1,000 is more preferable, and these may be arranged in any manner. Though the size of the probe card is not particularly limited, it is preferable for the diameter of a circle having the same area as the probe card as found through calculation to be no greater than approximately 250 mm.

In the method of producing a probe card of the present invention, the pitch of the bumps can be made large or small. Therefore, it is possible for the probe card to be designed so as to match the type of bumps that become probe terminals and the specifications of the semiconductor, and a group of probe terminals (group of fine bumps) can be provided with precision and incomparably high density, particularly in accordance with the demand of miniaturization. In the case where the group of probe terminals is provided with high density, for example, 1,000 terminals can be provided per $mm^2$, and 10,000 terminals can be also provided per $mm^2$.

A solvent of a liquid material used in the present invention may be water, tetradecane, toluene, alcohol or the like. A concentration of metal fine particulates in the solvent is preferably higher, and is preferably 40% by mass or more, and more preferably 55% by mass or more. In this regard, the concentration can be decided, considering the fluidity, the vapor pressure, the boiling point and other properties of the solvent and conditions for forming a three-dimensional structure, for example, the temperature of the substrate and/or the atmosphere, the vapor pressure, and the amount of the discharged liquid droplets for the following reason: for example, in the case that the boiling point of the solvent is low, the solvent component evaporates when the liquid droplets fly or land; accordingly, in many cases, the concentration at the time of the landing on a substrate is remarkably different from the discharged concentration of the particulates.

In order to form the three-dimensional structure, it is preferable that the viscosity of the liquid material used in the present invention is high. It is, however, necessary that the viscosity is within such a range that the paste can be inkjetted. Thus, it is necessary to decide the viscosity with attention. The viscosity also depends on the kind of the paste. In the case of, for example, a silver nano past, the viscosity is preferably from 3 to 50 centipoises (more preferably from 8 to 30 centipoises).

Though there are no particular limitations in terms of the boiling point of the solvent used for the liquid material as long as drying and solidification are appropriate, the boiling point is preferably 300° C. or less, more preferably 250° C. or less, and particularly preferably 220° C. or less. Further, materials having a considerably high drying speed and having its viscosity changed by a large amount by drying can be preferably used as for forming the three-dimensional structure. Time required for the droplet to be dried and solidified, the flying speed of the droplet, and the vapor pressure of solvent in the atmosphere can be set as appropriate according to the solution to be a material forming the three- dimensional structure. As for preferable conditions, a time for the droplet to be dried and solidified is preferably 2 seconds or less, more preferably 1 second or less, and particularly preferably 0.1 second or less; and a flying speed is preferably 4 m/sec or more, more preferably 6 m/sec or more, and particularly preferably 10 m/sec or more. A practical flying speed is 20 m/sec or less, although there is no upper limit. A preferable atmospheric pressure is less than a saturated vapor pressure of a solvent.

Since the producing method of the present invention utilizes optimal evaporation of droplets, the sizes of the discharged droplet can be reduced, and the three-dimensional structure can be formed with a cross-sectional diameter smaller than the diameter of the droplet at ejected. In other words, according to the production method of the present invention, the fine three-dimensional structure can be formal, even which is thought to be difficult in the conventional art, and a cross-sectional diameter of the fine three-dimensional structure can be freely controlled. Therefore, it is possible to control a cross-sectional diameter as appropriate not only by adjusting the diameter of a nozzle or the concentration of a solid component in the ejection fluid but also by using the evaporation of the ejected droplets. This control can be also determined in consideration of working efficiency such as time required to form the three-dimensional structure in addition to a required cross-sectional diameter.

Moreover, for example, the following method can be employed as another control method. That is, an applied voltage is increased to increase the amount of liquid for ejection, and thereby dissolve a stacked substance that has been previously dried, solidified, and stacked. Then the applied voltage is lowered to decrease the amount of liquid to thereby again promote stacking and growth of droplets in the direction of height. In this manner, by changing the applied voltage to repetitively increase or decrease the amount of liquid, it is possible to grow the three-dimensional structure while controlling a required cross-sectional diameter.

A range of a cross-sectional diameter, in the case of increasing a cross- sectional diameter, with taking the working efficiency into consideration, can preferably be made in 20 times or less of the inside diameter of the tip of the nozzle, and more preferably 5 times or less thereof. In the case of decreasing the cross-sectional diameter, the cross-sectional diameter can preferably be made in 1/10 or more times of the inside diameter of the tip of the nozzle, more preferably 1/5 or more times, and particularly preferably 1/2 or more times thereof.

In the process of stacking and building the solidified substance of droplets on the substrate in virtue of the evaporation of the ejected droplets in the manner described above, by controlling a temperature of a surface of the substrate, the volatile property of the liquid component of the droplet can be promoted when or after the droplet lands on the substrate, whereby the viscosity of the landed droplet can be increased within a desired period of time. Accordingly, for example, even under conditions where the droplet is usually hard to be stacked on because the amount of liquid of the droplet is too large, heating of the surface of the substrate makes it possible to accelerate the drying and solidifying of the droplet, and to stack and build the substance of the droplets, and hence formation of a three-dimensional structure can be realized. Moreover, the increasing of the speed of drying and solidifying the droplet can make the interval of ejecting droplets shorter and can improve working efficiency also.

A controlling means of the substrate temperature is not particularly limited, and examples thereof include a Peltier element, an electric heater, an infrared heater, a heater using fluid such as an oil heater, a silicon rubber heater, and a thermistor. Moreover, the substrate temperature can be controlled as appropriate according to the volatile property of liquid as a material or a droplet to be used, but it is preferably from 20 to 150° C., more preferably from 25° C. to 70° C., and particularly preferably from 30° C. to 50° C. The substrate temperature is preferably set at a temperature higher than that of the droplet at landing, preferably higher by approximately 50° C. or more than that of the landing droplet, and more preferably higher by approximately 10° C. or more than that of the landing droplet.

As for the amount of evaporation of the droplet, it is also thought to control the amount of evaporation of the droplet by the atmospheric temperature or the vapor pressure of solvent in the atmosphere, but according to the production method of the present invention, a three-dimensional structure can be produced by an industrially preferable method of controlling the temperature of the surface of the substrate without using a complicated apparatus.

Figure 3:
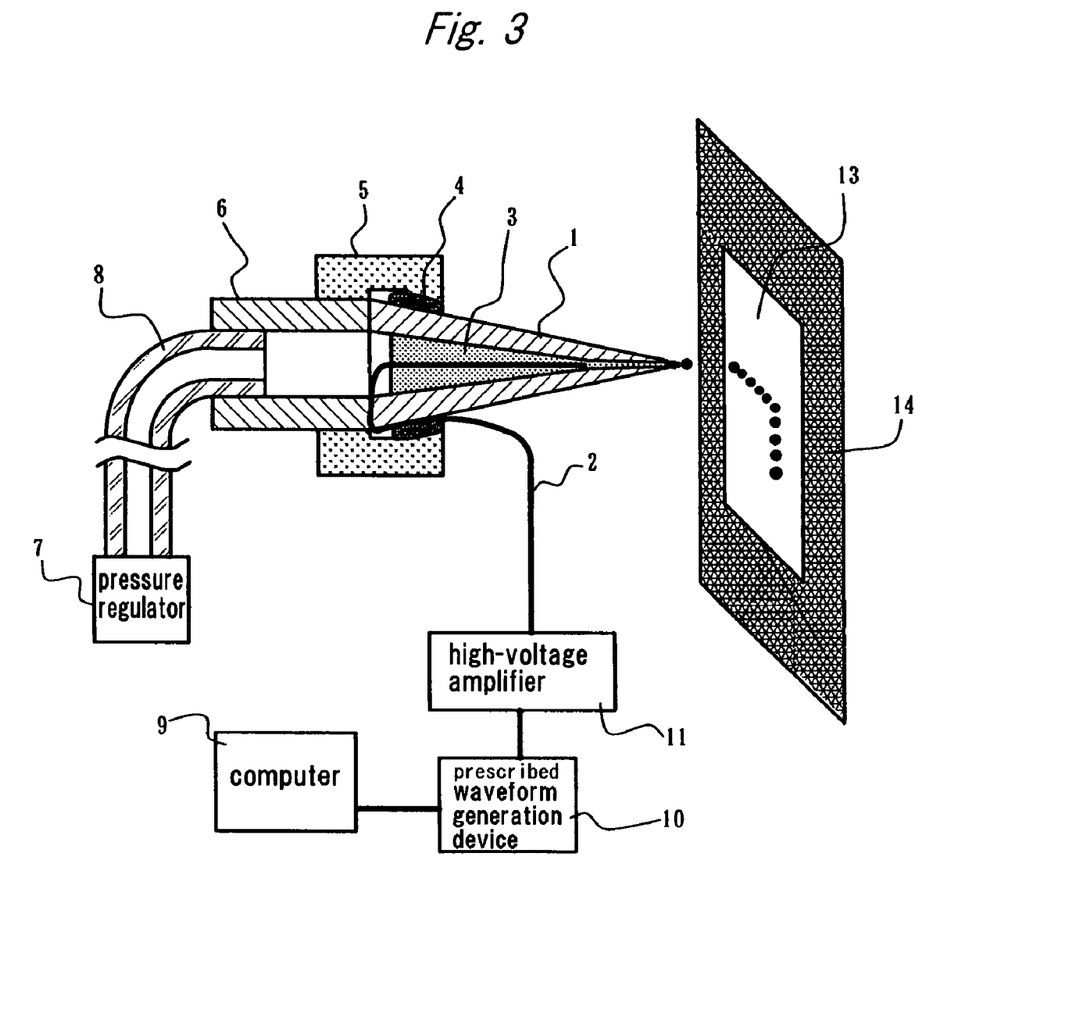
[FIG. 3] It is an explanatory drawing of one embodiment of a fine inkjet apparatus which is used in the production method of the present invention.

FIG. 3 is a drawing, partly in a cross section, of one embodiment of a fine inkjet apparatus preferably applicable for implementing the present invention (in the present invention, a method for focusing an electric field so that a fine droplet flies and adheres to a substrate, stacking the droplet through drying and solidification, and thus forming a fine bump is referred to as fine inkjet process, and the droplet-ejecting apparatus is referred to as fine inkjet apparatus). In order to realize the size of a fine droplet, a flow passage having a low conductance is preferably arranged near the nozzle 1, or the nozzle 1 itself preferably has a low conductance. For this purpose, a micro capillary tube made of glass is preferably used. However, as the material of the nozzle, a conductive material coated with an insulating material can also be used. The reasons why the nozzle 1 is preferably made of glass are as follows: a nozzle having a diameter of about several pm can be easily formed; the nozzle being tapered, an electric field is easily focused on the tip of the nozzle, an unnecessary solution moves upward by surface tension, and it is not retained at the nozzle end, that is, clogging of the nozzle is not caused; and the nozzle has approximate flexibility. Furthermore, the low conductance is preferably regarded as 10 to 10 $m^3/s$ or less. Although the shape to be a low conductance is not limited to the following shapes, as the shape, for example, a cylindrical, flow passage having a small inner diameter, or a flow passage which has an even flow passage diameter and in which a structure serving as a flow resistance is arranged, a flow passage is curved, or a flow passage having a valve is cited.

An inside diameter of the tip of the nozzle is preferably 0.01 μm or more, for manufacturing. Meanwhile, the upper limit of the inside diameter of the tip of the nozzle is preferably determined by an inside diameter of the tip of the nozzle when electrostatic force becomes larger than surface tension and an inside diameter of the tip of the nozzle when discharge conditions are satisfied by local electric field intensity. Furthermore, it is preferable that an amount of the droplet to be ejected is made smaller than the amount that can be solidified and stacked on by evaporation, and the diameter of the nozzle is preferably adjusted according to the preferable amount of the droplet. Hence, although the inside diameter of the nozzle is affected by voltage to be applied and the kind of fluid to be used, according to general conditions, the nozzle has an inside diameter of, preferably, 15 μm or less, and more preferably 10 μm or less. Furthermore, to more effectively use the effect of a focused electric field, it is particularly preferable that the inside diameter of the tip of the nozzle is from 0.01 to 8 μm.

Then, although an outside diameter of the tip of the nozzle is determined as appropriate in accordance with the inside diameter described above of the tip of the nozzle, the nozzle preferably has an outside diameter of the tip of 15 μm or less, more preferably 10 μm or less, and particularly preferably 8 μm or less. It is preferable that the nozzle is formed in the shape of a needle.

The nozzle 1 is not limited to a capillary tube but may be a two-dimensional pattern nozzle formed by fine-processing. Alternatively, a construction may be employed in which a needle-shape electrode and a nozzle for supplying fluid are formed separately from each other and arranged close to each other.

For example, when the nozzle 1 is made of glass having good formability, the nozzle cannot be used as an electrode. For this reason, an electrode made of a metal wire 2 (metal electrode wire) such as tungsten wire may be inserted into the nozzle 1, or an electrode may be formed in the nozzle by plating. When the nozzle 1 itself is formed by a conductive material, an insulating material may be coated on the nozzle 1. The position where the electrode is arranged is not limited, and the electrode may be arranged inside or outside the nozzle, or inside and outside the nozzle, or at a position separate from the nozzle.

A solution 3 to be ejected can be filled in the nozzle 1. In this embodiment, when an electrode is inserted in the nozzle, the electrode 2 is arranged to be dipped in the solution 3. The solution (fluid) 3 is supplied from a solution source (not shown in figures). The nozzle 1 is fixed to a holder 6 by a shield rubber 4 and a nozzle clamp 5 such that pressure is prevented from leaking.

Pressure regulated by the pressure regulator 7 is transmitted to the nozzle 1 through a pressure tube 8.

The nozzle, the electrode, the solution, the shield rubber, the nozzle clamp, the holder, and the pressure holder are shown by a sectional side view, and a substrate 13 is arranged by a substrate support 14 (substrate holder) such that the substrate 13 is close to the tip of the nozzle.

The role of the pressure regulation device that can be used in the method of producing a probe card of the present invention can be used to push a fluid out of the nozzle by applying high pressure to the nozzle. However, rather, the pressure regulation device is particularly effectively used to regulate a conductance, fill a solution in the nozzle, or eliminate clogging of the nozzle. Further, the pressure regulation device is effectively used to control the position of a liquid surface or form a meniscus. As another role of the pressure regulation device, the pressure regulation device gives a phase difference from a voltage pulse and a force acting on the liquid in the nozzle is controlled, thereby controlling a micro ejection rate.

An ejection signal from the computer 9 is transmitted to a prescribed waveform generation device 10 and controlled thereby.

A prescribed waveform voltage generated by the prescribed waveform generation device 10 is transmitted to the electrode 2 through a high-voltage amplifier 11. The solution 3 in the nozzle 1 is charged by the voltage. In this manner, the focused electric field intensity at the tip of the nozzle is increased.

Figure 4:
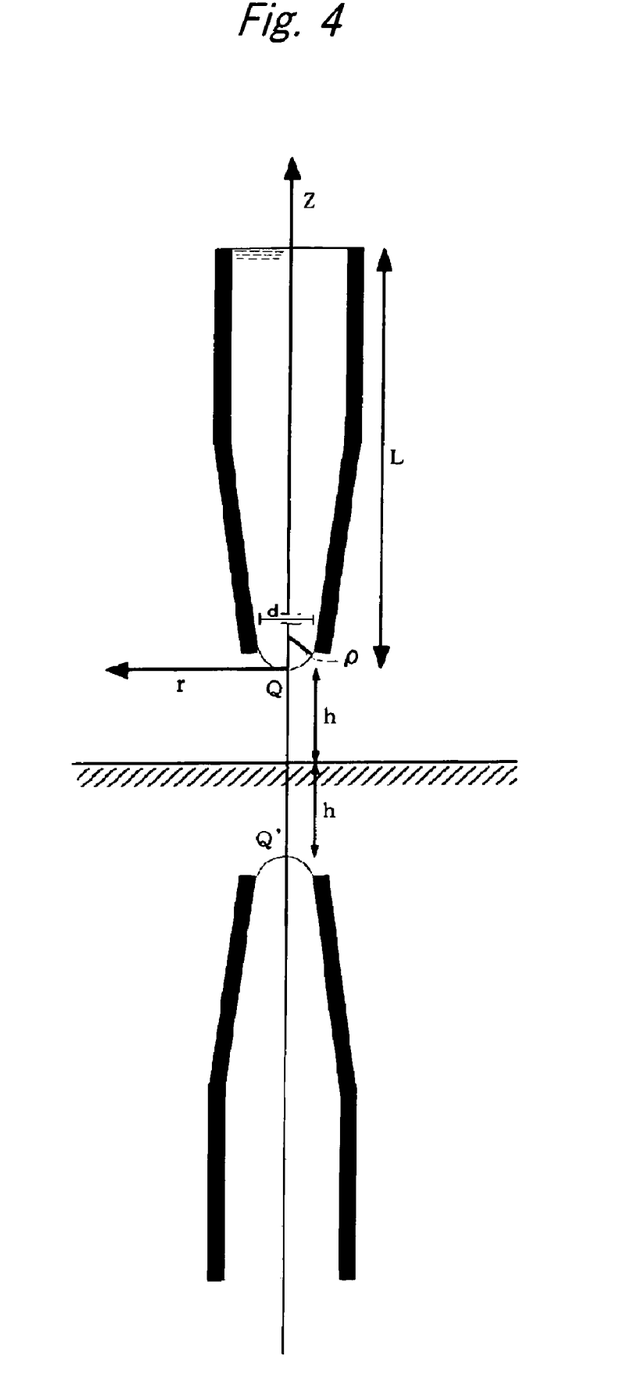
[FIG. 4] It is a schematic drawing for explaining calculation of an electric field intensity of a nozzle in the production method of the present invention.

In this embodiment, an electric field is focused on the tip portion of a nozzle, as shown in FIG. 4, so that the effects thereof cause a fluid droplet to be charged, and thus, the effects of the image force induced in the facing substrate are utilized. In this regard, FIG. 4 is a diagrammatical view schematically showing a state where a nozzle having an inside diameter d of the tip of the nozzle and filled with a conductive ink (fluid for droplet) is arranged vertically at a height of h from an endless plate-shaped conductive material. Then, r designates a direction parallel to the endless plate-shaped conductive material and Z designates a direction of Z axis (height). Furthermore, L and p designate the length of a flow passage and a radius of curvature, respectively. Q designates a charge induced at the tip of the nozzle and Q' designates an image charge induced at a symmetric position in the substrate and having an opposite charge. For this reason, it is not necessary to make a substrate 13 or a substrate support 14 conductive or to apply voltage to the substrate 13 or the substrate support 14, as applied in conventional art. Moreover, voltage to be applied can be reduced by increasing electric field intensity focused on the tip of the nozzle. Furthermore, voltage applied to an-electrode 2 may be plus or minus.

The distance between the nozzle 1 and the substrate 13 (hereinafter, unless otherwise specified, "the distance between the nozzle and the substrate" means the distance between the tip of the nozzle and the surface on the nozzle side of the substrate") can be adjusted as appropriate according to landing accuracy of the droplet given by an image force, or according to the amount of evaporation of the droplet during flight. That is, the distance between the nozzle and the substrate can be adjusted according to an increase in the viscosity of the droplet due to drying of the droplet during the flight. Then, the distance may be changed in accordance with the growth of the structure, and thereby it may be adjusted in such a way as to obtain that having higher aspect ratio. On the contrary, to avoid the influence of neighboring obtained structures close each other, the tip of the nozzle may be arranged at a position lower than the height of the structures. Meanwhile, in the case of ejecting the droplet on a concavo- convex surface of the substrate, a measure of distance is required to avoid the contact between the concavo-convex of the substrate and the tip of the nozzle. In consideration of landing accuracy of the droplet and the concavo-convex surface of the substrate, the nozzle 1 and the substrate 13 preferably have a distance of 500 μm or less. In the case where the concavo-convex of the surface of the substrate is little and a high degree of landing accuracy of the droplet is required, the nozzle 1 and the substrate 13 preferably have a distance of 100 μm or less, more preferably 50 μm or less. Meanwhile, to avoid the nozzle 1 from being too close to the substrate 13, the nozzle 1 and the substrate 13 preferably have a distance of 5 μm or more, more preferably 20 μm or more.

Although not shown in figures, feedback control performs for detecting a nozzle position to hold the nozzle 1 at a predetermined position with respect to the substrate 13. Further, the substrate 13 may be held such that the substrate 13 is placed on a conductive or insulating substrate holder.

According to the method of producing a probe card of the present invention, the height of the bump can be controlled through the time for ejection, change in the voltage, the temperature of the substrate, the height of the nozzle and the like. Meanwhile, in terms of the thickness of the bump, it becomes easy to form the three-dimensional structures as the amount of ejection is reduced.

At this time, a landed substance which has once started growing grows rapidly, and therefore it tends to become a thin and long structure. On the other hand, there are cases where it is desired for a thick structure to be formed or the diameter is desired to be changed, depending on the application. In such cases, it is possible to form a structure having any diameter by repeating the process of adjusting the voltage and the like so that the structure that has once grown is melted, and then making it grow again.

The fine inkjet apparatus used in the method of producing a probe card of the present invention can be compact, and there is high freedom in terms of its installation, and therefore it is possible to prepare multiple nozzles; for example, a fine inkjet apparatus as described in WO03/070381 is appropriate for use. Here, it is desirable for the applied voltage to be a pulse voltage, an alternating current voltage or an alternating current voltage to which a direct current bias is applied, where the duty ratio is optimized, but the applied voltage may be a direct current voltage.

According to the method of producing a probe card of the present invention, though it is practical, in terms of adjustment of the position for forming structures, to place a substrate holder on an X-Y-Z stage so that the position of the substrate 13 can be changed, the method is not limited to this, and it is possible to place the nozzle 1 on the X-Y-Z stage instead. Further, an inter- nozzle-substrate distance can be regulated to an appropriate distance by using a fine position adjusting device. Moreover, in the position regulation of the nozzle, a Z-axis stage is moved by closed loop control on the basis of distance data obtained by a laser micrometer, and the nozzle position can be kept constant at an accuracy of 1 μm or less.

In a conventional raster scan scheme, at a step for forming a continuous line, circuit pattern may be disconnected due to a lack of landing position accuracy, defective ejection, or the like. For this reason, in this embodiment, in addition to the raster scan scheme, a vector scan scheme is employed. It is described in, e.g., S. B. Fuller et al., Journal of Microelectromechanical systems, Vol. 11, No. 1, p. 54 (2002) that circuit drawing is performed by vector scanning using a single-nozzle inkjet.

In raster scanning, new control software which was developed to interactively designate a drawing position on a computer screen, may be used. In the case of vector scanning, when a vector data file is loaded, complex pattern drawing can be automatically performed. As the raster scan scheme, a scheme which is performed in a conventional printer can be properly used. As the vector scan scheme, a scheme used in a conventional plotter can be properly used.

For example, as a stage to be used, SGSP-20-35 (XY) and Mark-204 controller, each of which is available from SIGMA KOKI CO., LTD., are used. As control software, software is self-produced by using Labview available from National Instruments Corporation. A case in which the moving speed of the stage is regulated within the range of 1 μm/sec to 1 mm/sec to obtain the most preferable drawing will be considered below. Here, in the case of the raster scanning, the stage is moved at a pitch of 1 μm to 100 μm, and ejection can be performed by a voltage pulse, linking with the movement of the stage. In the case of the vector scanning, the stage can be continuously moved on the basis of vector data.

In the method of producing a probe card of the present invention, these methods for adjusting the position of ejection can allow the position for forming three-dimensional structures to be adjusted freely and rapidly through setting and input of control data. Accordingly, a probe card having an appropriate arrangement of probes that can flexibly deal with variation in the arrangement of electrodes and frequent change therein can be provided.

In the method of producing a probe card of the present invention, because the droplet discharged from a fine inkjet is fine, depending on the kind of solvent used for ink, the droplet evaporates instantly when the droplet lands on the substrate, thereby the droplet is instantaneously fixed at a landing position. In this condition, the drying speed of the droplet is order-of-magnitude larger than the drying speed of a droplet having a particle size of several tens tm produced by a conventional inkjet technology. This is caused by that the vapor pressure becomes significantly high due to the fineness of the droplets. Accordingly, a fine bump can be formed in a short time; for example, one (1) bump can be formed preferably in 0.1 to 300 seconds (though this depends on the material, structure, size and the like), more preferably in 5 seconds to 120 seconds. In accordance with conventional inkjet technology using a piezo system or the like, it is difficult to form a bump so fine as that formed in the production method of the present invention, in a short time, in addition, the landing accuracy becomes poor.

According to the method of producing a probe card of the present invention, fine bumps of which the aspect ratio can be freely set can be formed with high accuracy and high productivity, and thus, a probe card can be provided with high minuteness and high accuracy. Furthermore, it is also possible to produce an interposer or a multilayer substrate by using the method of producing a probe card of the present invention.

According to the method of producing a probe card of the present invention, it is possible to extremely decrease the amount of energy consumption required to form the probe card, and to eliminate the need for a photo mask and a die, and to facilitate prototype manufacturing. In addition, the method has the advantage of being able to put a necessary amount of resources into a necessary place. In addition, probe cards obtained by the producing method of the present invention can be applied to the field of technology for inspecting various electronic parts, such as electronic parts, display elements, IC's, LSI's, biochips and electrodes for living bodies, and the field of bioelectronics.

EXAMPLES

The present invention will be described in more detail based on examples below, but the present invention is not limited by these.

Example 1

A silver ultra-fine particle paste (Silver Nano Paste, made by Harima Chemicals, Inc., silver content: 58 mass %, specific weight: 1.72, viscosity: 8.4 cps) was ejected through inkjet as shown in FIG. 3, and thus, the nucleus portions of bumps were formed on a glass substrate on which gold was vapor deposited. Here, the inner diameter at the tip of the nozzle, the voltage applied to the paste within the nozzle in a room temperature atmosphere (22° C.) as the peak-to-peak voltage in the alternating current voltage, and the distance between the nozzle and the substrate, were set to 1 μm, approximately 450 V and approximately 100 μm, respectively. The time required to form the nucleus portion of one bump was 10 seconds.

Furthermore, a gold ultra-fine particle paste (Gold Nano Paste NPG-J, made by Harima Chemicals, Inc., gold content: 66.9 mass %, specific weight: 2.15, viscosity: 29.0 cps) was ejected through inkjet as shown in FIG. 3, and thus, the surface layer portions of the bumps were formed, to give a probe card.

The time required to form the surface layer portion of one bump was 5 seconds. Here, the inner diameter at the tip of the nozzle, the voltage applied to the paste within the nozzle in a room temperature atmosphere (22° C.) as the peak-to-peak voltage in the alternating current voltage, and the distance between the nozzle and the substrate, were set to 1 µm, approximately 200 V and approximately 100 µm, respectively.

The cross-sectional diameter of the bumps (total of the nucleus portion and the surface layer portion) of the produced probe card was approximately 5 µm, the height was approximately 20 µm, and the pitch of the bumps was 50 µm.

Figure 5:
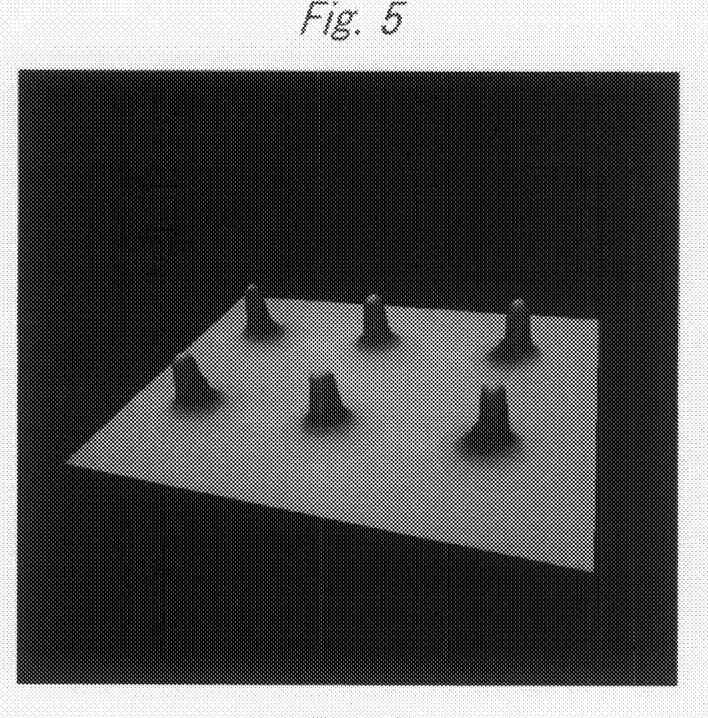
[FIG. 5] It is a laser microscope photograph, instead of a drawing, showing the bumps on the probe card gained in Example 1.
Figure 6:
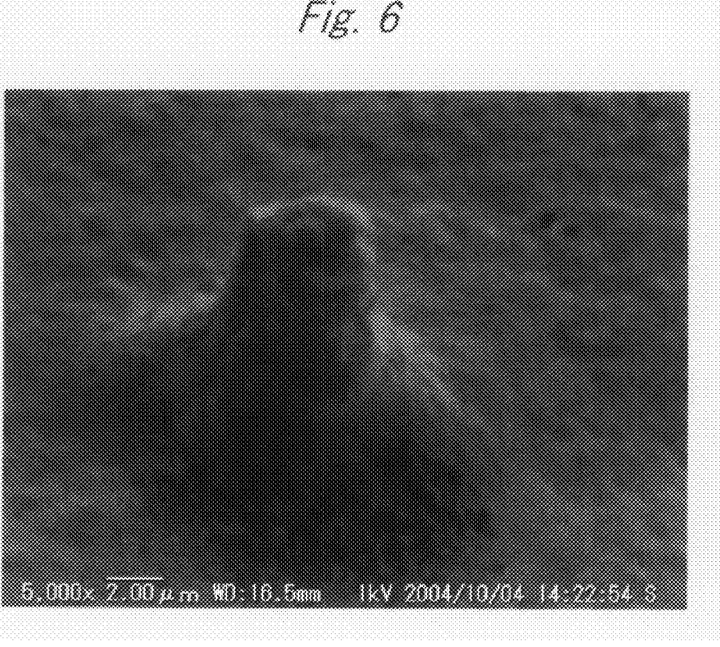
[FIG. 6] It is a microscope photograph (magnification: 5,000 times), instead of a drawing, showing the bump on the probe card gained in Example 1.

FIG. 5 is a laser microscope photograph showing the thus-formed six bumps. In addition, FIG. 6 is a further-enlarged microscope photograph (magnification: 5,000 times) showing one bump of FIG. 5.

Example 2

The nucleus portions of bumps were formed in the same manner as in the method of forming the nucleus portions of bumps shown in Example , except that the nozzle was rotated with a rotational radius of 7.5 µm during the formation. Next, surface layer portions of the bumps were formed in the same manner as in the method of forming the surface layer portions of the bumps described in Example 1, and thus, a probe card was produced.

The bumps on the produced probe card were in the shape of hollow truncated cones where the thickness of the walls was approximately 3 µm, the diameter of the truncated cones in the vicinity of the tip portion was approximately 8 µm in a cross section, and the height was approximately 40 µm.

Figure 7:
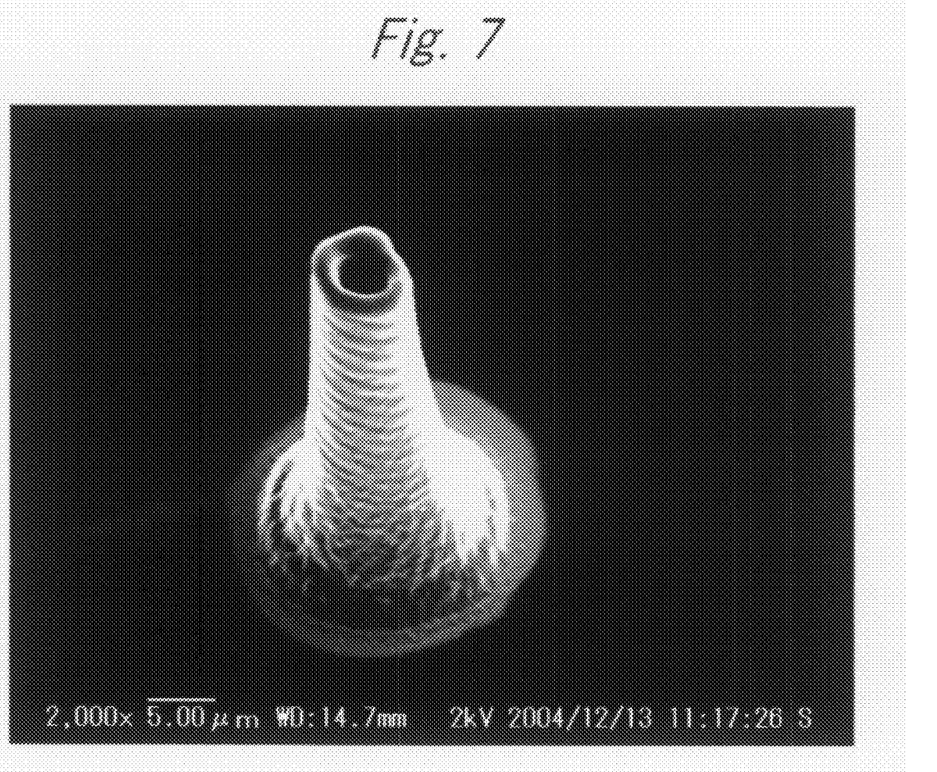
[FIG. 7] It is a microscope photograph (magnification: 2,000 times), instead of a drawing, showing the bump on the probe card gained in Example 2.

FIG. 7 is a microscope photograph (magnification: 2,000 times) showing the thus-produced bump.

INDUSTRIAL APPLICABILITY

The probe cards obtained by the producing method of the present invention can be applied to the field of technology for inspecting various electronic parts, such as electronic parts, display elements, IC's, LSI's, biochips and electrodes for living bodies, and the field of bioelectronics.

The invention claimed is:

1. A method of producing a probe card, which comprises the steps of:
    ejecting fine droplets of a liquid material containing metal ultra-fine particles onto a substrate by a fine inkjet process; and
    forming fine bumps on the substrate,
wherein the fine inkjet process comprises:
    flying and landing ejected fine droplets continually onto the substrate by virtue of a focused electric field, wherein the fine droplets are dried and solidified while flying, and
    stacking the solidified fine droplets continuously to form the fine bumps on a prescribed position of the substrate.

2. The method of producing a probe card according to claim 1, wherein a nucleus portion of the fine bumps is formed of a silver material and the surface layer portion of the fine bumps is formed of a gold material.

3. The method of producing a probe card according to claim 1 or 2, wherein a substrate having flexibility is used as the substrate.

4. The method of producing a probe card according to claim 1, wherein a resin having flexibility is provided on the substrate and the fine bumps are formed above the resin.

5. The method of producing a probe card according to claim 1, wherein the diameter of the fine bumps in a cross section is 1 to 50 mm.

6. The method of producing a probe card according to claim 1, wherein, in the fine inkjet process, the ejected fine droplets fly along an electric line of force and are attracted to a top part of the fine bumps, thereby being selectively and accurately stacked onto the top part of the fine bumps in order to grow the fine bumps.

7. The method of producing a probe card according to claim 1, wherein the fine droplets are ejected from a nozzle having a needle shape and an inside diameter of 0.01 to 8 µm.

8. The method of producing a probe card according to claim 7, wherein the focused electric field is generated by applying a waveform voltage to the nozzle.

9. The method of producing a probe card according to claim 1, wherein the fine droplets have a diameter of 15 µm or less.

10. A probe card, comprising:
    a substrate, and
    a plurality of fine bumps on the substrate,
wherein:
    each of the plurality of fine bumps has a cross-sectional diameter of 50 µm or less, and
    the fine bumps are formed by ejecting fine droplets of a liquid material containing metal ultra-fine particles by a fine inkjet process, wherein the fine inkjet process comprises:
    flying and landing ejected fine droplets continually onto the substrate by virtue of a focused electric field, wherein the fine droplets are dried and solidified while flying, and
    stacking the solidified fine droplets continuously to form the fine bumps on a prescribed position of the substrate.

11. The probe card according to claim 10, wherein a resin having flexibility is provided on the substrate and the fine bumps are formed above the resin.

12. The probe card according to claim 10, wherein the diameter of the fine bumps in a cross section is 1 to 50 mm.

13. The probe card according to claim 10, wherein a group of the fine bumps is provided with a short pitch on the substrate.

14. The probe card according to claim 10, wherein a nucleus portion of the fine bumps is formed of a silver material and the surface layer portion of the fine bumps is formed of a gold material.

15. The probe card according to claim 10, wherein heat treatment is carried out on the fine bumps so that pores are created within the fine bumps.

16. The probe card according to claim 10, wherein each of the plurality of fine bumps has an aspect ratio of 1 or more.

17. The probe card according to claim 10, wherein each of the plurality of fine bumps has a height of from 5 to 50 µm.

18. The probe card according to claim 10, wherein a pitch between the fine bumps is 10 µm or less.

19. A method of producing a probe card, which comprises the steps of:
    (a) ejecting a fine droplet of a liquid material containing metal ultra-fine particles from a nozzle toward a prescribed position of a substrate by virtue of an electric field focused at the tip of the nozzle, by applying a waveform voltage to the nozzle, wherein the liquid droplet is dried and solidifies into a solidified droplet upon landing onto the substrate;
    (b) ejecting a subsequent droplet of the liquid material in the same manner as in step (a), wherein the subsequent droplet solidifies into a subsequent solidified droplet, and stacking the subsequent solidified droplet onto the solidified droplet of (a), wherein each ejected fine droplet flies along an electric line of force and is attracted to a top part of a previously ejected and solidified droplet; and (c) repeating the step (b) continually to form a fine bump formed of metal particles standing at a prescribed position on the substrate.

* * * * *